(12) United States Patent
Lee

(10) Patent No.: US 8,824,223 B2
(45) Date of Patent: Sep. 2, 2014

(54) SEMICONDUCTOR MEMORY APPARATUS WITH CLOCK AND DATA STROBE PHASE DETECTION

(75) Inventor: Sang Hee Lee, Ichon (KR)

(73) Assignee: SK hynix Inc. (KR)

( * ) Notice: Subject to any disclaimer, the term of this patent is extended or adjusted under 35 U.S.C. 154(b) by 929 days.

(21) Appl. No.: 12/970,587

(22) Filed: Dec. 16, 2010

(65) Prior Publication Data

US 2011/0085387 A1  Apr. 14, 2011

Related U.S. Application Data

(63) Continuation-in-part of application No. 12/026,449, filed on Feb. 5, 2008, now abandoned.

(51) Int. Cl.
| | |
|---|---|
| G11C 11/4063 | (2006.01) |
| G11C 11/4076 | (2006.01) |
| G06Q 30/02 | (2012.01) |
| G11C 11/4096 | (2006.01) |
| G11C 7/22 | (2006.01) |
| G11C 7/10 | (2006.01) |
| H04L 29/08 | (2006.01) |

(52) U.S. Cl.
CPC ........ *G06Q 30/0251* (2013.01); *G11C 11/4076* (2013.01); *G06Q 30/0272* (2013.01); *G11C 11/4096* (2013.01); *G06Q 30/02* (2013.01); *G11C 7/222* (2013.01); *G11C 7/1066* (2013.01); *H04L 67/00* (2013.01); *G11C 7/1096* (2013.01); *G11C 7/22* (2013.01); *G11C 2207/2254* (2013.01); *G11C 7/1078* (2013.01)
USPC .......................................... 365/193; 365/194

(58) Field of Classification Search
CPC .......... G11C 7/22; G11C 7/222; G11C 7/225; G11C 8/18
USPC .................................................. 365/193, 194
See application file for complete search history.

(56) References Cited

U.S. PATENT DOCUMENTS

| | | | |
|---|---|---|---|
| 6,373,289 | B1 | 4/2002 | Martin et al. |
| 6,570,944 | B2 | 5/2003 | Best et al. |
| 6,707,723 | B2 | 3/2004 | Jeong |
| 6,950,370 | B2 | 9/2005 | Lee |
| 6,965,539 | B2 | 11/2005 | Lee |
| 6,987,704 | B2 | 1/2006 | Park |
| 7,042,799 | B2 | 5/2006 | Cho |
| 7,068,549 | B2 | 6/2006 | Cho |
| 7,143,258 | B2 | 11/2006 | Bae |
| 7,224,625 | B2 | 5/2007 | Dietrich et al. |
| 7,433,262 | B2 | 10/2008 | Vergnes et al. |
| 7,450,443 | B2 | 11/2008 | Cheng |
| 7,580,301 | B2 | 8/2009 | Cheng |
| 2001/0004335 | A1 | 6/2001 | Murakami |
| 2006/0193194 | A1 | 8/2006 | Schnell |
| 2007/0195615 | A1 | 8/2007 | Chen |
| 2009/0091992 | A1 | 4/2009 | Lee |

FOREIGN PATENT DOCUMENTS

| | | |
|---|---|---|
| CN | 1637952 | 7/2005 |
| JP | 11-328963 | 11/1993 |
| KR | 100322530 | 1/2002 |

*Primary Examiner* — Harry W Byrne
*Assistant Examiner* — Lance Reidlinger
(74) *Attorney, Agent, or Firm* — Baker & McKenzie LLP

(57) ABSTRACT

A semiconductor memory apparatus includes an internal tuning unit configured to tune a generation timing of a data input strobe signal according to a phase difference between an external clock signal and a data strobe clock signal, and a data input sense amplifier configured to transmit data bits to a global line in response to the data input strobe signal.

13 Claims, 4 Drawing Sheets

(12) United States Patent
US 8,824,223 B2

SEMICONDUCTOR MEMORY APPARATUS WITH CLOCK AND DATA STROBE PHASE DETECTION

CROSS-REFERENCE TO RELATED PATENT APPLICATION

This is a continuation-in-part application of U.S. patent application Ser. No. 12/026,449, filed on Feb. 5, 2008, which is incorporated herein in its entirety by reference as if set forth in full, and which claims the benefit under 35 U.S. 119(a) of Korean Application No. 10-2007-0101590, filed on Oct. 9, 2007, in the Korean Intellectual Property Office, the disclosure of which is incorporated herein in its entirety by reference as if set forth in full.

BACKGROUND

1. Technical Field

The embodiments described herein relate to a semiconductor memory apparatus, and more particularly, to a semiconductor memory apparatus that is capable of stably performing a data input operation.

2. Related Art

An exemplary semiconductor memory apparatus includes a plurality of data input buffers and a plurality of data strobe clock buffers. In an advanced semiconductor memory apparatus, for example, a DDR SDRAM (Double Data Rate Synchronous Dynamic Random Access Memory), data bits, which are serially input through data input buffers, are individually latched in a plurality of latch circuits under the control of a data strobe clock signal, aligned in a MUX circuit, and transmitted to a data input sense amplifier in parallel. Then, the data input sense amplifier receives the plurality of data bits transmitted in parallel and transmits them to a global line under the control of a data input strobe signal. The semiconductor memory apparatus includes a data input strobe signal generating circuit, and generates the data input strobe signal in response to an external clock signal and a write command signal.

Since apparatuses, which are located outside the semiconductor memory apparatus and transmit data bits to the semiconductor memory apparatus, do not operate with the same timing, all of the data bits are not input to the semiconductor memory apparatus with the same timing.

Accordingly, a time margin between the input data bits and the external clock signal of the semiconductor memory apparatus functions as an important factor to stably perform a data input operation. However, as the operation speed of the semiconductor memory apparatus increases, the time margin between the input data bits and the external clock signal has been reduced. As a result, it becomes increasingly difficult to stably perform a data input operation. FIG. 1 illustrates the stability problem when data bits are input at a high frequency.

FIG. 1 shows two cases with respect to timing relation between four data bits 'd1' to 'd4', which are input in serial to a data input circuit, and an external clock signal 'CLK_EXT'. In the first case, data bits 'd1' to 'd4' are input with relatively advanced timing on the basis of the external clock signal 'CLK_EXT'. Meanwhile, in the second case, as compared with the first case, the data bits 'd1' to 'd4' are input with relatively delayed timing on the basis of the external clock signal 'CLK_EXT'.

As such, the input timing of the data bits is not constant. Thus, a data input strobe signal 'dinstb' needs to be enabled so as to ensure an accurate operation of the data input circuit. However, in a high frequency clock signal environment, the regions surrounded by the dotted lines in FIG. 1 become extremely narrow. As a result, generation timing of the data input strobe signal 'dinstb' is not constant or the data input strobe signal 'dinstb' is not generated.

That is, due to an increase in the operation speed of conventional semiconductor memory apparatus, the timing margin of the data input strobe signal has been reduced, which lowers stability of the data input circuit in a conventional semiconductor memory apparatus.

SUMMARY

In an exemplary embodiment of the present disclosure, a semiconductor memory apparatus can include an internal tuning unit configured to tune a generation timing of a data input strobe signal according to a phase difference between an external clock signal and a data strobe clock signal, and also include a data input sense amplifier configured to transmit data bits to a global line in response to the data input strobe signal, wherein the internal tuning unit is configured to control a delay amount of the external clock signal depending upon a detection result for the phase difference and output the data input strobe signal.

In another exemplary embodiment of the present disclosure, a semiconductor memory apparatus can include a data input control unit configured to detect a phase difference between an external clock signal and a data strobe clock signal, and generate a data input control signal, and also include a data input circuit configured to control a delay amount of the external clock signal in response to the data input control signal and output a data input strobe signal, align and amplify an input data in response to the data input strobe signal, and transmit the aligned and amplified input data to a global line.

In yet another exemplary embodiment of the present disclosure, a semiconductor memory apparatus can include an internal tuning unit configured to tune a generation timing of a data input strobe signal according to a phase difference between an external clock signal and a data strobe clock signal, and a data input sense amplifier configured to transmit data bits to a global line in response to the data input strobe signal, wherein the internal tuning unit is configured to control a delay amount of the external clock signal depending upon a detection result for the phase difference and output the data input strobe signal, wherein the internal tuning unit comprises: a data input control unit configured to receive the data strobe clock signal and the external clock signal, and generate a first control signal and a second control signal and, a data input strobe signal generating unit configured to generate the data input strobe signal in response to the external clock signal, a write command signal, the first control signal, and the second control signal, which includes a signal combining section configured to combine the write command signal and the external clock signal, a first delay section configured to selectively delay an output signal of the signal combining section in response to the first control signal, and a second delay section configured to selectively delay an output signal of the first delay section in response to the second control signal, and outputs the data input strobe signal.

In yet another exemplary embodiment of the present disclosure, a semiconductor memory apparatus can include a data input control unit configured to detect a phase difference between an external clock signal and a data strobe clock signal, and generate a first control signal and a second control signal, and also include a data input circuit configured to control a delay amount of the external clock signal in response to the first control signal and the second control signal and output a data input strobe signal, align and amplify an input data in response to the data input strobe signal, and transmit the aligned and amplified input data to a global line, wherein the data input circuit comprises: a data aligning unit configured to align the input data bits in parallel in response to the data strobe clock signal; a data input strobe signal generating unit configured to generate the data input strobe signal in response to the external clock signal, a write command signal, the first control signal, and the second control signal, which includes a signal combining section configured to combine the write command signal and the external clock signal, a first delay section configured to selectively delay an output signal of the signal combining section in response to the first control signal, a second delay section configured to selectively delay an output signal of the first delay section in response to the second control signal, and output the data input strobe signal; and a data input sense amplifier configured to amplify the aligned input data bits in response to the data input strobe signal.

These and other features, aspects, and embodiments are described below in the section entitled "Detailed Description."

BRIEF DESCRIPTION OF THE DRAWINGS

Features, aspects, and embodiments are described in conjunction with the attached drawings, in which.

DETAILED DESCRIPTION

Figure 1:
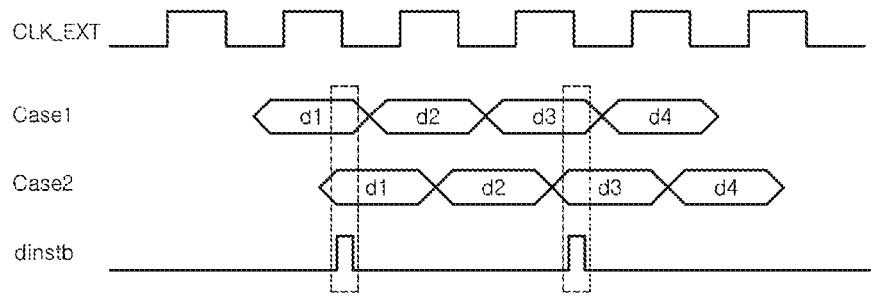
FIG. 1 is an exemplary timing chart illustrating the operation of a data input circuit of a semiconductor memory apparatus.
Figure 2:
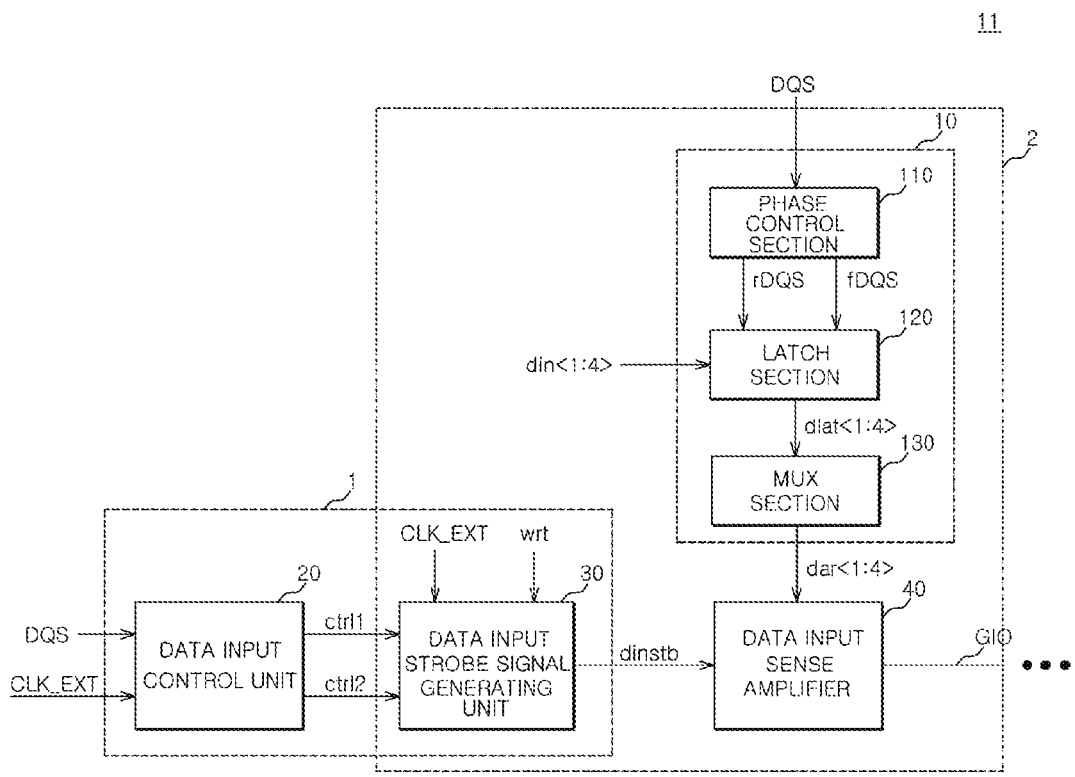
FIG. 2 is a block diagram illustrating a structure of a semiconductor memory apparatus according to one aspect.

FIG. 2 is a block diagram illustrating a data input circuit 11 that can be included in a semiconductor memory apparatus according to an embodiment. In the embodiment illustrated in FIG. 2, the circuit 11 can be configured to align four serial data bits in parallel, and amplify the data bits under the control of a data input strobe signal.

As shown in FIG. 2, the circuit 11 can include a data aligning unit 10, a data input control unit 20, a data input strobe signal generating unit 30, and a data input sense amplifier 40. The data aligning unit 10 can align four serial input data bits 'din<1:4>' in parallel in response to a data strobe clock signal 'DQS', and transmit the aligned input data bits to the data input sense amplifier 40. The data aligning unit 10 can include a phase control section 110, a latch section 120, and a MUX section 130.

The phase control section 110 can control a phase of the data strobe clock signal 'DQS' and output a rising strobe clock signal 'rDQS' and a falling strobe clock signal 'fDQS'. The latch section 120 can latch each of the four input data bits 'din<1:4>' in response to the rising strobe clock signal 'rDQS' and the falling strobe clock signal 'fDQS'. The MUX section 130 can receive four data bits 'dlat<1:4>', which are obtained by latching the input data bits 'din<1:4>' by the latch section 120, and simultaneously transmit the four latched data bits 'dlat<1:4>' to the data input sense amplifier 40. Through the above-described operation, the four input data bits 'din<1:4>', as parallel aligned data bits 'dar<1:4>', are transmitted to the data input sense amplifier 40.

The data input control unit 20 and the data input strobe signal generating unit 30 can be referred to as an internal tuning unit 1. The internal tuning unit 1 can tune the generation timing of a data input strobe signal 'dinstb' according to timing of an external clock signal 'CLK_EXT' and a data strobe clock signal 'DQS'.

The data aligning unit 10, the data input strobe signal generating unit 30, and the data input sense amplifier 40 constitute a data input circuit 2. That is the data input circuit 2 can align and amplify the four input data bits 'din<1:4>' and transmit the input aligned and amplified data bits to a global line GIO in response to a data input control signal that is transmitted from the data input control unit 20. In the description below, the data input control signal will be implemented as a first control signal 'ctrl1' and a second control signal 'ctrl2'.

The data input control unit 20 can receive the data strobe clock signal 'DQS' and an external clock signal 'CLK_EXT' and can generate the first control signal 'ctrl1' and the second control signal 'ctrl2'. At this time, the data input control unit 20 can compensate for the time delay of the data strobe clock signal 'DQS', and the time delay of the external clock signal 'CLK_EXT'. The data input buffer can receive the data bits using the data strobe clock signal.

Thus, in order to extract information on a phase difference between the data strobe clock signal and the external clock signal, the data input control unit 20 can be configured to compensate for the delayed amounts of the data strobe clock signal 'DQS' and the external clock signal 'CLK_EXT', as described above. The data input control unit 20 can transmit the extracted information on the phase difference between the data strobe clock signal and the external clock signal to the data input strobe signal generating unit 30, such that control timing of the data input strobe signal 'dinstb' can be controlled.

If the phase of the data strobe clock signal is more advanced than the phase of the external clock signal by the first time or more, then the data input control unit 20 can enable the first control signal 'ctrl1'. Meanwhile, if the phase of the data strobe clock signal is more delayed than the phase of the external clock signal by the second time or more, then the data input control unit 20 can enable the second control signal ctrl2. In this case, the first time and the second time can be the same.

The data input strobe signal generating unit 30 can generate the data input strobe signal 'dinstb' in response to the external clock signal 'CLK_EXT', a write command signal 'wrt', the first control signal 'ctrl1', and the second control signal 'ctrl2'. The write command signal 'wrt' can be used to ensure a generation interval of the data input strobe signal 'dinstb' during a write operation. If the first control signal 'ctrl1' is enabled in a state where the write command signal 'wrt' is enabled, then the data input strobe signal generating unit 30 can decrease the delay time endowed with the external clock signal 'CLK_EXT' to advance the generation timing of the data input strobe signal 'dinstb'. Meanwhile, if the second control signal 'ctrl2' is enabled in a state where the write command signal 'wrt' is enabled, then the data input strobe signal generating unit 30 can increase the delay time endowed with the external clock signal 'CLK_EXT' to delay the generation timing of the data input strobe signal 'dinstb'.

Then, the data input sense amplifier 40 can transmit the aligned data bits 'dar<1:4>', which can be transmitted from the data aligning unit 10, to the global line GIO in response to the data input strobe signal 'dinstb'.

In the circuit 11, according to one embodiment, if the timing difference of the data strobe clock signal and the external clock signal exceeds a critical value that is defined by the first time and the second time, then the data input control unit 20 can enable the first control signal 'ctrl1' or the second control signal 'ctrl2'. The data input strobe signal generating unit 30 can control the generation timing of the data input strobe signal 'dinstb' according to whether the first control signal 'ctrl1' is enabled or the second control signal ctrl2 is enabled. Accordingly, the data input strobe signal 'dinstb' can be generated with variable timing in response to the tinning difference between the data strobe clock signal and the external clock signal. As a result, a data input operation can be stably performed.

Figure 3:
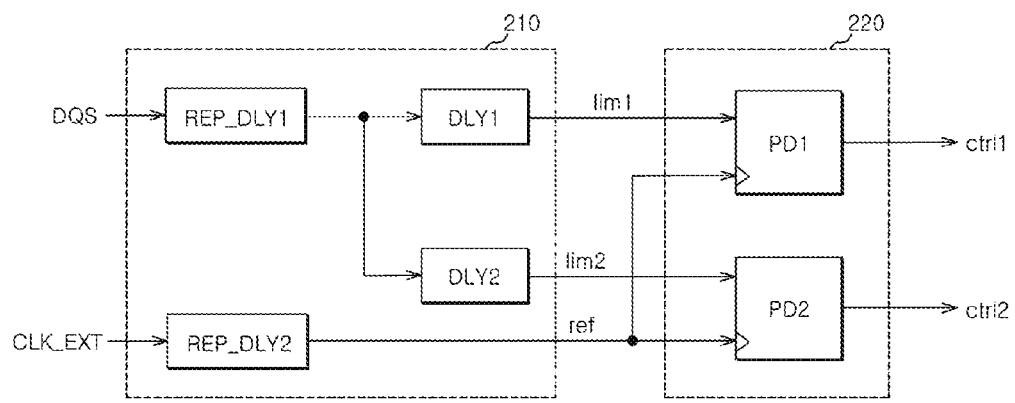
FIG. 3 is a diagram illustrating a detailed structure of a data input control unit that can be included in the apparatus illustrated in FIG. 2.

FIG. 3 is a diagram illustrating a detailed structure of a data input control unit that can be included in the circuit illustrated in FIG. 2. Referring to FIG. 3, the data input control unit 20 can include a critical value setting section 210 and a phase comparing section 220. The critical value setting section 210 can set a critical value for a phase difference of the data strobe clock signal and the external clock signal, thereby generating a reference signal 'ref', a first critical value signal 'lim1', and a second critical value signal 'lim2'. The critical value setting section 210 can includes a first replica delay REP_DLY1, a first delay DLY1, a second replica delay REP_DLY2, and a second delay DLY2.

The first replica delay REP_DLY1 can delay the data strobe clock signal 'DQS' by the predetermined time. At this time, the first replica delay REP_DLY1 can give the delayed time, which is needed to compensate for the delayed amount of the data strobe clock signal 'DQS'.

The second replica delay REP_DLY2 can delay the external clock signal 'CLK_EXT' by the predetermined time and output the reference signal 'ref'. The second replica delay REP_DLY2 can give the delayed time, which is needed to compensate for the delayed amount of the external clock signal 'CLK_EXT'.

The delay amounts of the first replica delay REP_DLY1 and the second replica delay REP_DLY2 can be appropriately adjusted through testing, such that the timing of the data strobe clock signal and the external clock signal are accurately compensated.

The first delay DLY1 can delay an output signal of the first replica delay REP_DLY1 by the first time and output the first critical value signal 'lim1'. The second delay DLY2 can advance the output signal of the first replica delay REP_DLY1 by the second time and output the second critical value signal lim2.

A critical value for the timing difference of the data strobe clock signal and the external clock signal defined by the first time and the second time can be set as required for a particular implementation and the delay values of the first delay DLY1 and the second delay DLY2 can be appropriately adjust as required for a particular implementation.

The phase comparing section 220 can discriminate phases of the first critical value signal 'lim1' and the second critical value signal 'lim2' on the basis of the reference signal 'ref', and generate the first control signal 'ctrl1' and the second control signal 'ctrl2'. The phase comparing section 220 can include a first phase comparator PD1 and a second phase comparator PD2.

The first phase comparator PD1 can discriminate the phase of the first critical value signal 'lim1' on the basis of the reference signal 'ref' and generates the first control signal 'ctrl1'. The second phase comparator PD2 can discriminate the phase of the second critical value signal 'lim2' on the basis of the reference signal 'ref' and generate the second control signal 'ctrl2'. The first phase comparator PD1 and the second phase comparator PD2 can be easily implemented by using an edge-trigger-typed flip-flop.

When the phase of the data strobe clock signal matches the phase of the external clock signal, the phase of the reference signal 'ref' can be more advanced than the phase of the first critical value signal 'lim1', and can be more delayed than the phase of the second critical value signal 'lim2'.

Then, if the phase of the data strobe clock signal is more advanced than the phase of the external clock signal by the first time or more, then the phase of the first critical value signal 'lim1' can be more advanced than the phase of the reference signal 'ref'. At this time, the first phase comparator PD1 can detect the change in the phase and enable the first control signal 'ctrl1'.

Meanwhile, if the phase of the external clock signal is more advanced than the phase of the data strobe clock signal by the second time or more, then the phase of the reference signal ref can be more advanced than the phase of the second critical value signal 'lim2'. At this time, the second phase comparator PD2 can detect the change in the phase and enable the second control signal ctrl2. Additionally, the first control signal 'ctrl1' can be implemented as a low enable signal and the second control signal 'ctrl2' can be implemented as a high enable signal.

Figure 4:
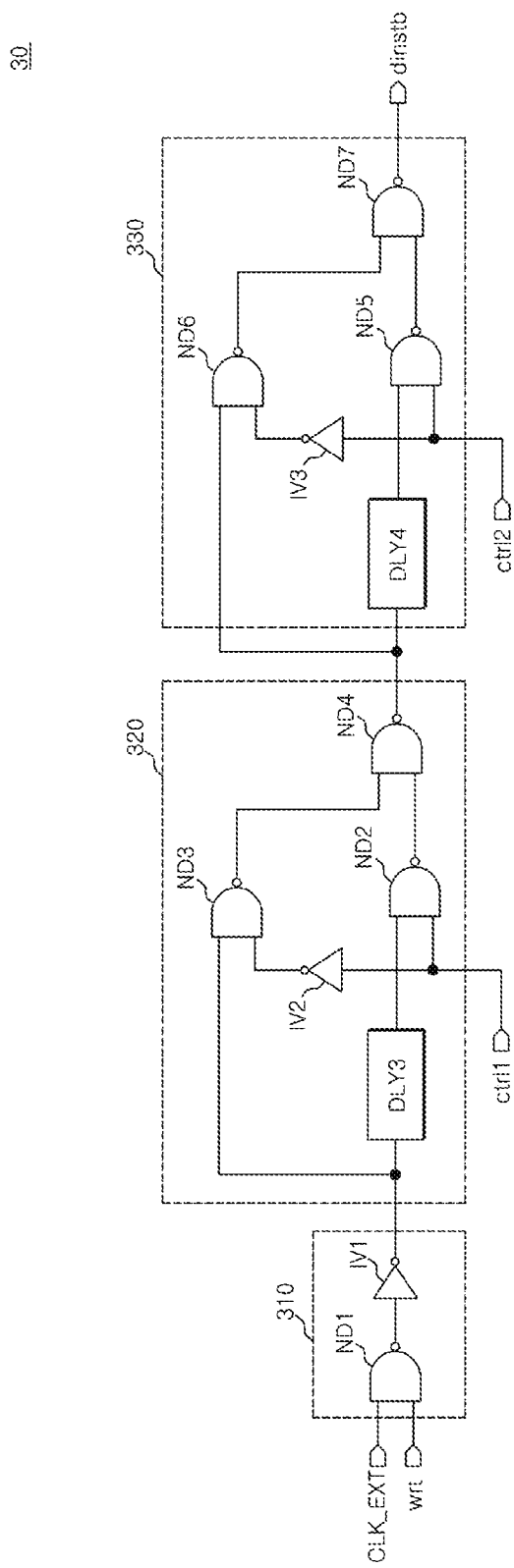
FIG. 4 is a diagram illustrating a detailed structure of a data input strobe signal generating unit that can be included in the apparatus illustrated in FIG. 2.

FIG. 4 is a diagram illustrating a detailed structure of a data input strobe signal generating unit that can be included in the circuit illustrated in FIG. 2. Referring to FIG. 4, the data input strobe signal generating unit 30 can include a signal combining section 310, a first delay section 320, and a second delay section 330.

The signal combining section 310 can combine the write command signal 'wrt' and the external clock signal 'CLK_EXT'. The signal combining section 310 can include a first NAND gate ND1 that can receive the write command signal 'wrt' and the external clock signal 'CLK_EXT', and a first inverter IV1 that can receive an output signal of the first NAND gate ND1.

The first delay section 320 can selectively delay the output signal of the signal combining section 310 in response to the first control signal 'ctrl1'. The first delay section 320 can include a third delay DLY3, a second inverter IV2, a second NAND gate ND2, a third NAND gate ND3, and a fourth NAND gate ND4.

The third delay DLY3 can delay the output signal of the signal combining section 310 by the predetermined time. The second NAND gate ND2 can receive the first control signal 'ctrl1' and an output signal of the third delay DLY3. The second inverter IV2 can receive the first control signal 'ctrl1'. The third NAND gate ND3 can receive the output signal of the signal combining section 310 and an output signal of the second inverter IV2. The fourth NAND gate ND4 can receive an output signal of the second NAND gate ND2 and an output signal of the third NAND gate ND3.

The second delay section 330 can selectively delay the output signal of the first delay section 320 in response to the second control signal 'ctrl2' and output the data input strobe signal 'dinstb'. The second delay section 330 can include a fourth delay DLY4, a third inverter IV3, a fifth NAND gate ND5, a sixth NAND gate ND6, and a seventh NAND gate ND7.

The fourth delay DLY4 can delay the output signal of the first delay section 320 by the predetermined time. The fifth NAND gate ND5 can receive the second control signal 'ctrl2' and an output signal of the fourth delay DLY4. The third inverter IV3 can receive the second control signal 'ctrl2'. The sixth NAND gate ND6 can receive the output signal of the first delay section 320 and an output signal of the third inverter IV3. The seventh NAND gate ND7 can receive an output signal of the fifth NAND gate ND5 and an output signal of the sixth NAND gate ND6 and can output the data input strobe signal 'dinstb'.

In the data input strobe signal generating unit 30 that has the above-described structure, if the write command signal 'wrt' is enabled, then the output signal of the signal combining section 310 can become a signal having the same type as the external clock signal 'CLK_EXT'. At this time, the first control signal 'ctrl1' and the second control signal 'ctrl2' can be disabled, and the first control signal 'ctrl1' can have a high voltage level and the second control signal 'ctrl2' can also have a high voltage level. In this case, the data input strobe signal 'dinstb' can become a signal having a form in which the external clock signal 'CLK_EXT' does not pass through the fourth delay DLY4 and is can be delayed by the third delay DLY3.

If only the first control signal "ctrl1 is enabled, then the data input strobe signal 'dinstb' can become a signal having a form in which the external clock signal 'clk_in' can pass through neither the third delay DLY3 or the fourth delay DLY4. Accordingly, the generation timing of the data input strobe signal 'dinstb' can be advanced.

Meanwhile, if the first control signal 'ctrl1' is disabled and the second control signal 'ctrl2' is enabled, then the data input strobe signal 'dinstb' can become a signal having a form in which the external clock signal 'CLK_EXT' passes through the third delay DLY3 and the fourth delay DLY4. Accordingly, the generation timing of the data input strobe signal 'dinstb' can be delayed.

That is, if the phase of the data strobe clock signal is more advanced than the phase of the external clock signal by the first time or more, then the first control signal 'ctrl1' can be enabled. As a result, the generation timing of the data input strobe signal 'dinstb' can be advanced. Meanwhile, if the phase of the external clock signal is more advanced than the phase of the data strobe clock signal by the second time or more, then the second control signal 'ctrl2' can be enabled. As a result, the generation timing of the data input strobe signal 'dinstb' is delayed. In a circuit 11 configured according to this embodiment, the data input strobe signal 'dinstb' can have the generation timing that varies in response to the phases of the data strobe clock signal and the external clock signal.

Figure 5:
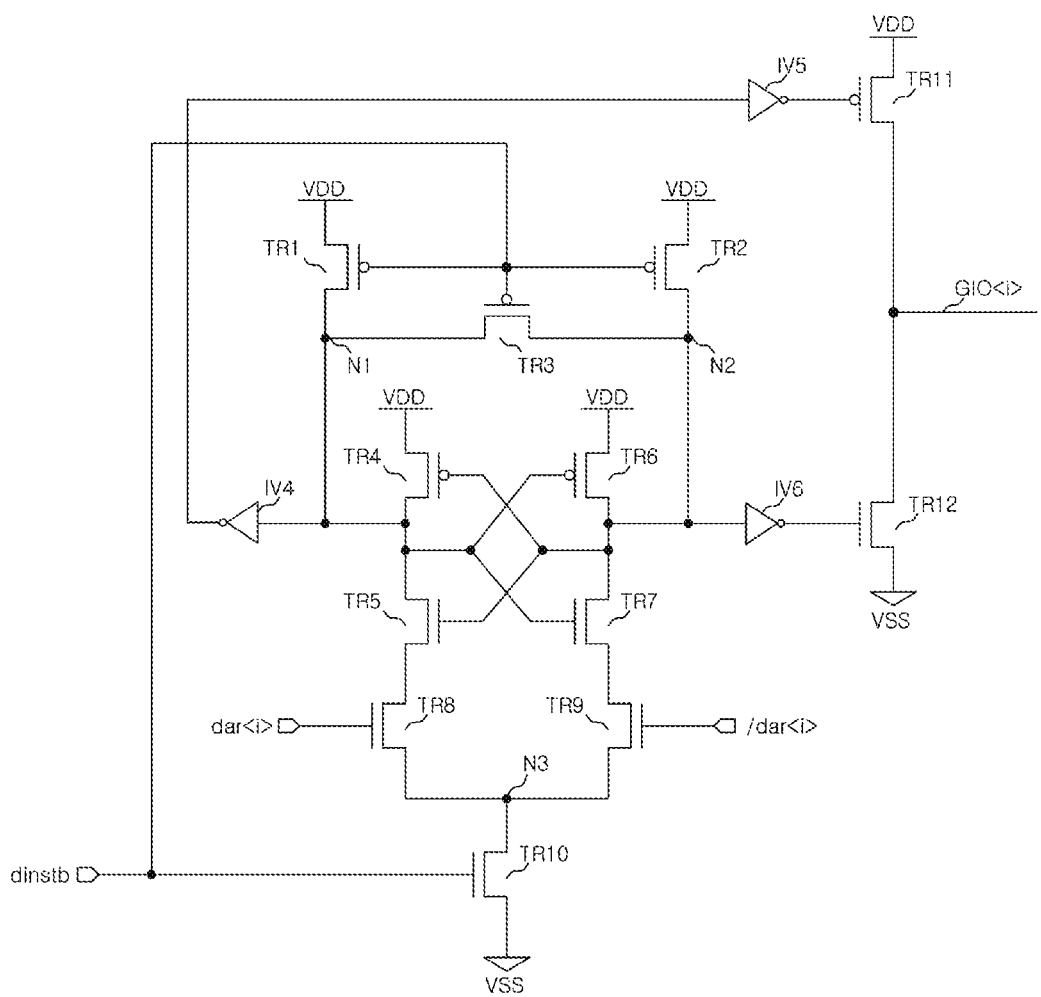
FIG. 5 is a diagram illustrating a detailed structure of a data input sense amplifier that can be included in the apparatus illustrated in FIG. 2.

FIG. 5 is a diagram illustrating a detailed structure of a data input sense amplifier that can be included in the circuit illustrated in FIG. 2. FIG. 5 can exemplify any one of four sense amplifiers that are included in the data input sense amplifier 40. In FIG. 5, it is assumed that any one of the four aligned data bits 'dar<1:4>' can be implemented as positive aligned data bit 'dar<i>' and negative aligned data bit '/dar<i>'. Further, it is assumed that a plurality of global lines GIO<i> can be collectively constitute the global line GIO as illustrated in FIG. 2.

The data input sense amplifier 40 can include first to twelfth transistors TR1 to TR12 and fourth to sixth inverters IV4 to IV6. The first transistor TR1 can include a gate configured to receive the data input strobe signal 'dinstb', a source supplied with an external voltage (VDD), and a drain connected to a first node N1. The second transistor TR2 can include a gate configured to receive the data input strobe signal 'dinstb', a source supplied with the external voltage (VDD), and a drain connected to a second node N2. The third transistor TR3 can include a gate configured to receive the data input strobe signal 'dinstb', and which can be disposed between the first node N1 and the second node N2.

The fourth transistor TR4 can include a gate that can be connected to the second node N2, a source that can be supplied with the external voltage (VDD), and a drain that can be connected to the first node N1. The fifth transistor TR5 can include a gate connected to the second node N2 and a drain connected to the first node N1. The sixth transistor TR6 can include a gate connected to the first node N1, a source supplied with the external voltage (VDD), and a drain connected to the second node N2. The seventh transistor TR7 can include a gate connected to the first node N1 and a drain connected to the second node N2.

The eighth transistor TR8 can include a gate that can receive the positive aligned data bit 'dar<i>', a drain connected to a source of the fifth transistor TR5, and a source connected to a third node N3. The ninth transistor TR9 can include a gate configured to receive the negative aligned data bit '/dar<i>', a drain connected to a source of the seventh transistor TR7, and a source connected to the third node N3. The tenth transistor TR10 can include a gate configured to receive the data input strobe signal 'dinstb', a drain connected to the third node N3, and a source applied to a ground voltage (VSS).

The fourth inverter IV4 receives a voltage that is applied to the first node N1. The fifth inverter IV5 receives an output signal of the fourth inverter IV4. The sixth inverter IV6 receives a voltage that is applied to the second node N2. The eleventh transistor TR11 includes a gate that receives an output signal of the fifth inverter IV5, a source that is applied to the external voltage (VDD), and a drain that is connected to the global line GIO<i>. The twelfth transistor TR12 includes a gate that receives an output signal of the sixth inverter IV6, a drain that is connected to the global line GIO<i>, and a source that is applied to a ground voltage (VSS).

As described above, the semiconductor memory apparatus according to the embodiments described herein can compensate for the delayed amounts of the external clock signal and the data strobe clock signal, compare the phases of the compensated clock signals, and determine the phase difference of the external clock signal and the data strobe clock signal.

When the semiconductor memory apparatus determines that the phase of the data strobe clock signal is more advanced than the phase of the external clock signal, enough to exceed the critical value according to the determined phase difference information, the semiconductor memory apparatus can advance the generation timing of the data input strobe signal. Meanwhile, when it is determined that the phase of the data strobe clock signal is delayed more than the phase of the external clock signal, enough to exceed the critical value according to the determined phase difference information, the semiconductor memory apparatus can further delays the generation timing of the data input strobe signal.

The data bits, which can be input in serial and transmitted to the data input sense amplifier in parallel, can be stably transmitted to the global line. In a semiconductor memory apparatus according to the embodiments described herein the timing margin of the data input strobe signal can be reduced due to the increase in the operation speed of the semiconductor memory apparatus. Therefore, the data input circuit 11 of such a semiconductor memory apparatus can stably operate.

While certain embodiments have been described above, it will be understood that the embodiments described are by way of example only. Accordingly, the apparatus and methods described herein should not be limited based on the described embodiments. Rather, the apparatus and methods described herein should only be limited in light of the claims that follow when taken in conjunction with the above description and accompanying drawings.

What is claimed is:

1. A semiconductor memory apparatus comprising:
an internal tuning unit configured to tune a generation timing of a data input strobe signal according to a phase difference between an external clock signal and a data strobe clock signal; and
a data input sense amplifier configured to transmit data bits to a global line in response to the data input strobe signal, wherein the internal tuning unit is configured to control a delay amount of the external clock signal depending upon a detection result for the phase difference and output the data input strobe signal,
wherein the internal tuning unit comprises:
a data input control unit configured to receive the data strobe clock signal and the external clock signal, and generate a first control signal and a second control signal; and
a data input strobe signal generating unit configured to generate the data input strobe signal in response to the external clock signal, a write command signal, the first control signal, and the second control signal, which includes a signal combining section configured to combine the write command signal and the external clock signal, a first delay section configured to selectively delay an output signal of the signal combining section in response to the first control signal, and a second delay section configured to selectively delay an output signal of the first delay section in response to the second control signal, and outputs the data input strobe signal.

2. The semiconductor memory apparatus of claim 1, wherein the data input control unit is configured to compensate for a delay of the data strobe clock signal and a delay of the external clock signal, and detect the phase difference between the data strobe clock signal and the external clock signal.

3. The semiconductor memory apparatus of claim 2, wherein the data input control unit is configured to enable the first control signal when a phase of the data strobe clock signal is more advanced than a phase of the external clock signal by a first time or more, and enable the second control signal when the phase of the external clock signal is more advanced than the phase of the data strobe clock signal by a second time or more.

4. The semiconductor memory apparatus of claim 3, wherein the data input control unit comprises:
a critical value setting section configured to set a critical value for the phase difference of the data strobe clock signal and the external clock signal, and generate a reference signal, a first critical value signal, and a second critical value signal from the data strobe clock signal and the external clock signal; and
a phase comparing section configured to discriminate phases of the first and second critical value signals on the basis of the reference signal, and generate the first control signal and the second control signal.

5. The semiconductor memory apparatus of claim 1, wherein the data input strobe signal generating unit is configured to decrease the delay time for the external clock signal to advance generation timing of the data input strobe signal when the write command signal is enabled and the first control signal is enabled, and wherein the data input strobe signal generating unit is configured to increase the delay time for the external clock signal to delay the generation timing of the data input strobe signal when the write command signal is enabled and the second control signal is enabled.

6. The semiconductor memory apparatus of claim 1, further comprising:
a data aligning unit configured to align a plurality of input data bits, being input in series, in parallel and transmit the plurality of aligned input data bits to the data input sense amplifier in response to the data strobe clock signal.

7. The semiconductor memory apparatus of claim 6, wherein the data aligning unit includes:
a phase control section that controls a phase of the data strobe clock signal and outputs a rising strobe clock signal and a falling strobe clock signal;
a latch section configured to latch the plurality of input data bits in response to the rising strobe clock signal and the falling strobe clock signal; and
a MUX section configured to receive the plurality of input data bits latched by the latch and simultaneously transmit the plurality of input data bits to the data input sense amplifier.

8. A semiconductor memory apparatus comprising:
a data input control unit configured to detect a phase difference between an external clock signal and a data strobe clock signal, and generate a first control signal and a second control signal; and
a data input circuit configured to control a delay amount of the external clock signal in response to the first control signal and the second control signal and output a data input strobe signal, align and amplify an input data in response to the data input strobe signal, and transmit the aligned and amplified input data to a global line,
wherein the data input circuit comprises:
a data aligning unit configured to align the input data bits in parallel in response to the data strobe clock signal;
a data input strobe signal generating unit configured to generate the data input strobe signal in response to the external clock signal, a write command signal, the first control signal, and the second control signal, which includes a signal combining section configured to combine the write command signal and the external clock signal, a first delay section configured to selectively delay an output signal of the signal combining section in response to the first control signal, a second delay section configured to selectively delay an output signal of the first delay section in response to the second control signal, and output the data input strobe signal; and
a data input sense amplifier configured to amplify the aligned input data bits in response to the data input strobe signal.

9. The semiconductor memory apparatus of claim 8, wherein the data input control unit is configured to compensate for a delay of the data strobe clock signal and a delay of the external clock signal, and detect the phase difference between the data strobe clock signal and the external clock signal.

10. The semiconductor memory apparatus of claim 9, wherein the data input control unit is configured to enable the first control signal when a phase of the data strobe clock signal is more advanced than a phase of the external clock signal by a first time or more, and enable the second control signal when the phase of the external clock signal is more advanced than the phase of the data strobe clock signal by a second time or more.

11. The semiconductor memory apparatus of claim 10, wherein the data input control unit comprises:
- a critical value setting section configured to set a critical value for the phase difference of the data strobe clock signal and the external clock signal, and generate a reference signal, a first critical value signal, and a second critical value signal from the data strobe clock signal and the external clock signal; and
- a phase comparing section configured to discriminate phases of the first and second critical value signals on the basis of the reference signal, and generate the first control signal and the second control signal.

12. The semiconductor memory apparatus of claim 11, wherein the data aligning unit comprises:
- a phase control section configured to control a phase of the data strobe clock signal and outputs a rising strobe clock signal and a falling strobe clock signal;
- a latch section configured to latch the input data bits in response to the rising strobe clock signal and the falling strobe clock signal; and
- a MUX section configured to receive the input data bits latched by the latch section and simultaneously transmit the input data bits to the data input sense amplifier.

13. The semiconductor memory apparatus of claim 12, wherein the data input strobe signal generating unit is configured to decrease the delay time for the external clock signal to advance generation timing of the data input strobe signal when the write command signal is enabled and the first control signal is enabled, and wherein the data input strobe signal generating unit is configured to increase the delay time for the external clock signal to delay the generation timing of the data input strobe signal when the write command signal is enabled and the second control signal is enabled.

* * * * *